(12) United States Patent
Choi

(10) Patent No.: US 11,885,847 B2
(45) Date of Patent: Jan. 30, 2024

(54) AUTOMATICALLY TESTABLE SHORT CIRCUIT BREAKER

(71) Applicant: KOREA ELECTROTECHNOLOGY RESEARCH INSTITUTE, Changwon-si (KR)

(72) Inventor: Young Kil Choi, Gimhae-si (KR)

(73) Assignee: KOREA ELECTROTECHNOLOGY RESEARCH INSTITUTE

(*) Notice: Subject to any disclaimer, the term of this patent is extended or adjusted under 35 U.S.C. 154(b) by 450 days.

(21) Appl. No.: 17/331,828

(22) Filed: May 27, 2021

(65) Prior Publication Data

US 2021/0341538 A1 Nov. 4, 2021

Related U.S. Application Data

(63) Continuation of application No. PCT/KR2019/016737, filed on Nov. 29, 2019.

(30) Foreign Application Priority Data

Nov. 30, 2018 (KR) .......... 10-2018-0152078

(51) Int. Cl.
*G01R 31/327* (2006.01)
*H02H 3/08* (2006.01)

(52) U.S. Cl.
CPC .......... *G01R 31/327* (2013.01); *H02H 3/08* (2013.01)

(58) Field of Classification Search
CPC ................ G01R 31/327; H02H 3/08
See application file for complete search history.

(56) References Cited

U.S. PATENT DOCUMENTS

| 2017/0317483 | A1* | 11/2017 | Seon | ............ | H01H 83/226 |
| 2019/0348216 | A1* | 11/2019 | Kim | ............ | G01R 19/165 |
| 2020/0185903 | A1* | 6/2020 | Marumo | ............ | G01R 31/14 |

FOREIGN PATENT DOCUMENTS

| KR | 20-0391445 Y1 | 8/2005 |
| KR | 20-0440531 Y1 | 6/2008 |
| KR | 10-0990860 B1 | 10/2010 |
| KR | 10-2013-0141091 A | 12/2013 |
| KR | 10-1410745 B1 | 6/2014 |
| KR | 10-1553766 B1 | 9/2015 |
| KR | 10-2018-0117265 A | 10/2018 |

OTHER PUBLICATIONS

Korean Notice of Allowance (KR 10-2018-0152078), KIPO, dated Sep. 10, 2019.
International Search Report (PCT/KR2019/016737), WIPO, dated Mar. 6, 2020.

* cited by examiner

*Primary Examiner* — Jue Zhang
*Assistant Examiner* — Lakaisha Jackson
(74) *Attorney, Agent, or Firm* — Park & Associates IP Law Office

(57) ABSTRACT

Proposed is an automatically testable short circuit breaker that includes: a pseudo short circuit signal driving circuit unit connected to opposite ends of a test button in a short circuit breaker; a pseudo short circuit signal recognition circuit unit which recognizes a short circuit detection signal and outputs a diagnosis signal; and a pseudo short circuit signal shut-off circuit unit which induces the short circuit detection signal to grounding so that the short circuit detection signal does not flow into the driving unit.

5 Claims, 1 Drawing Sheet

AUTOMATICALLY TESTABLE SHORT CIRCUIT BREAKER

REFERENCE TO RELATED APPLICATIONS

This is a continuation of pending International Patent Application PCT/KR2019/016737 filed on Nov. 29, 2019, which designates the U.S. and claims priority of Korean Patent Application No. 10-2018-0152078 filed on Nov. 30, 2018, the entire contents of which are incorporated herein by reference.

FIELD OF THE INVENTION

The present disclosure relates to a short circuit breaker and, more particularly, to an automatically testable short circuit breaker that is capable of checking a short circuit detection function of the short circuit breaker without shutting off a power supply, even without pressing a test button.

BACKGROUND OF THE INVENTION

In general, a short circuit breaker that shuts off electricity by detecting a short circuit includes a short circuit detection circuit configured to detect the short circuit. When the short circuit detection circuit of the short circuit breaker does not perform such a function properly, there is a risk of a short circuit electric shock or fire, so regular checking of the short circuit detection circuit is required.

In the meanwhile, in checking the existing short circuit breaker, a method of directly checking whether the shut-off unit operates with a random short circuit current generated by directly pressing a test button provided in the short circuit breaker was used, but in such a case, electronic devices in use by being connected to the short circuit breaker being a main power supply are turned off every time checking is performed. When the electronic devices are turned off and then restarted, there is an inconvenience that in some cases, it is necessary for the electronic devices be reset or a loading time is required until being restarted. Accordingly, various disclosures have been proposed to prevent the shut-off unit from operating during checking of the short circuit breaker, and there have been Patent Document [0003] Korean Patent No. 10-0990860 'ELECTRIC LEAKAGE TEST SYSTEM AND METHOD OF ELECTRIC LEAKAGE BREAKER' and Patent Document [0002] Korean Patent No. 10-1553766 'EARTH LEAKAGE CIRCUIT BREAKER'.

However, in such cases, it was still necessary to check the short circuit breaker by pressing a separate test button directly, so it was inconvenient to check the short circuit breaker due to the nature of the short circuit breaker mainly provided in a relatively remote location, and it was difficult to perform the regular checking unless a person in charge was assigned thereto. Furthermore, after the short circuit detector unit of the short circuit detector was damaged by the surrounding environment such as lightning, the short circuit detector did not operate properly, making it difficult to deal with the actual short circuit. As a disclosure for solving such a problem, there was a Patent Document [0001] Korean Patent No. 10-1410745 'EARTH LEAKAGE CIRCUIT BREAKER'.

However, even in such a case, in order to generate an effect for generating a pseudo short circuit as pressing the test button does, additional winding to the existing zero phase current transformer was to be accomplished and then connected to the controller. Therefore, it was greatly inconvenient to apply an above approach to the existing short circuit breaker. In addition, a constant current is to flow to the zero phase current transformer and the driving unit whenever the short circuit breaker is checked, so the possibility of operability of the shut-off unit or of circuit damage, due to an instantaneous malfunction, still remains.

SUMMARY OF THE INVENTION

Accordingly, the present disclosure has been made keeping in mind the above problems occurring in the related art, and an objective of the present disclosure is to provide a short circuit breaker that is automatically testable according to a predetermined interval without pressing a test button and has a power supply not being shut off during a test even without additional windings to the zero phase current transformer.

In order to accomplish the above objective, the present disclosure may provide an automatically testable short circuit breaker, wherein the short circuit breaker may include: power supply lines connected to a main power supply circuit; a test button configured to generate a short circuit current in the power supply lines, thereby checking an operating state of the short circuit breaker; a zero phase current transformer configured to detect the short circuit current between the power supply lines; a shut-off unit installed in the power supply lines, thereby performing functions of supplying and shutting off a power supply; a driving unit configured to control a power supply shut-off operation of the shut-off unit; and a short circuit detection unit configured to determine whether a short circuit current is generated from the zero current transformer, thereby generating a short circuit detection signal, the short circuit breaker further including: a pseudo short circuit signal driving circuit unit connected to opposite ends of the test button, thereby generating, without having windings with respect to the zero phase current transformer, a pseudo short circuit signal giving the same effect as when the opposite ends of the test button are connected to each other; a pseudo short circuit signal recognition circuit unit connected between the short circuit detection unit and the driving unit and configured to recognize the short circuit detection signal, thereby outputting a diagnosis signal; a pseudo short circuit signal shut-off circuit unit connected between the pseudo short circuit signal recognition circuit unit and the driving unit and configured to induce the short circuit detection signal to grounding in a condition that the pseudo short circuit signal driving circuit unit operates, so that the short circuit detection signal is shut off without flowing into the driving unit; and a controller configured not only to generate a driving signal giving the same effect as when the test button is pressed to the pseudo short circuit signal driving circuit unit so as to give the same effect as when the opposite ends of the test button are connected to each other but also to determine whether the short circuit breaker operates normally by receiving the diagnosis signal output from the pseudo short circuit signal recognition circuit unit.

In addition, the short circuit breaker of claim 1, further including: a square wave generation circuit configured to form a square wave by receiving the power supply from the power supply lines, thereby providing a generation-reference signal for generating the driving signal, which may give the same effect as when the test button is pressed, to the controller, wherein the controller may be configured to receive the generation-reference signal from the square wave generation circuit, thereby generating the driving signal, which gives the same effect as when the test button is pressed, on the basis of a generation interval of the generation-reference signal.

In addition, the controller may be further configured to: adjust a generation interval of the driving signal giving the same effect as when the test button is pressed according to a setting value, on the basis of the above input generation-reference signal.

In addition, the controller may further include: a display device configured to display visually and recognizably whether or not the diagnosis signal from the pseudo short circuit signal recognition circuit unit is input.

In addition, the pseudo short circuit signal driving circuit unit, the pseudo short circuit signal recognition circuit unit; the pseudo short circuit signal shut-off circuit unit, or the square wave generation circuit may be configured to be electrically insulated using an optical coupling device.

According to the present disclosure as described above, there is an advantage of providing a short circuit breaker that automatically checks whether the short circuit detection function thereof is damaged according to a predetermined interval without shutting off a power supply.

DETAILED DESCRIPTION OF THE INVENTION

Figure 1:
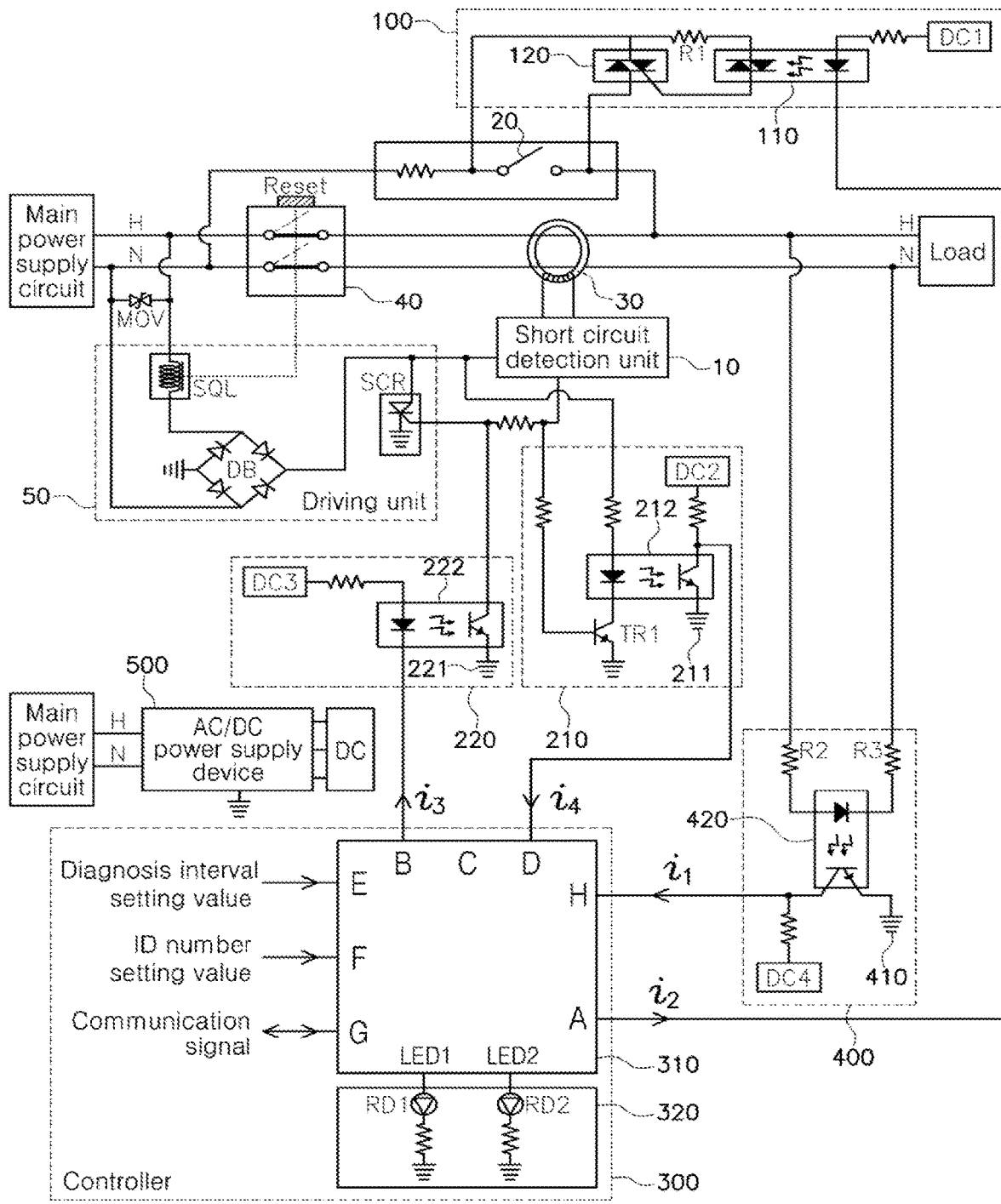
FIG. 1 is an internal circuit diagram of a short circuit breaker according to an embodiment of the present disclosure.

Hereinafter, the present disclosure will be described with reference to the drawings, and in the description of the present disclosure, when it is determined that a detailed description of related known technology or configuration may unnecessarily obfuscate the gist of the present disclosure, the detailed description thereof will be omitted.

In addition, the terms described below are terms defined in consideration of functions in the present disclosure, which may vary depending on the intention or custom of a user or an operator, so the definition should be made on the basis of the content throughout the present specification describing the present disclosure.

Hereinafter, in an embodiment of the present disclosure, an automatically testable short circuit breaker will be described.

With reference to FIG. 1, a short circuit breaker according to the present disclosure is configured to basically include: power supply lines H and N of a main power circuit; a test button 20 configured to generate a short circuit current in the power supply lines H and N, thereby checking an operating state of the short circuit breaker; a zero phase current transformer 30 configured to detect the short circuit current between the power supply lines H and N; a shut-off unit 40 installed in the power supply lines H and N, thereby performing functions of supplying and shutting off a power supply; a driving unit 50 configured to control a power supply shut-off operation of the shut-off unit 40; and a short circuit detection unit 10 configured to determine whether a short circuit current is generated from the zero current transformer 30, thereby generating a short circuit detection signal. In addition, the automatically testable short circuit breaker further includes: a pseudo short circuit signal driving circuit unit 100; a pseudo short circuit signal recognition circuit unit 210; a pseudo short circuit signal shut-off circuit unit 220; and a controller 300.

The pseudo short circuit signal driving circuit unit 100 is a circuit that is connected to opposite ends of the test button 20 and generates a pseudo short circuit signal that gives the same effect as when the opposite ends of the test button are connected to each other, wherein the circuit generates a short circuit current in the power supply lines H and N the same as when the test button 20 is manually operated. Accordingly, the short circuit detection unit 10 generates a short circuit detection signal not only when an actual short circuit occurs and when the test button 20 is operated, but also when a pseudo short circuit signal is generated in the pseudo short circuit signal driving circuit unit 100.

Looking at an exemplary configuration example of the pseudo short circuit signal driving circuit unit 100, the pseudo short circuit signal driving circuit unit 100 is connected to the opposite ends of the test button 20 and may connect the controller 300 and the power supply lines H and N, to be electrically insulated, by a phototriac 110.

More specifically, a light emitting side of the phototriac 110 is installed between a first DC power supply DC1 and a driving signal output terminal A of the controller 300, wherein the first DC power supply DC1 is branched off from an AC/DC power supply device 500 of an insulation type being separately connected to the main power supply circuits, one side of a light receiving side of the phototriac 110 is connected to a gate of a triac 120, and the triac 120 may be connected to the opposite ends of the test button 20.

Therefore, according to the configuration example of the pseudo short circuit signal driving circuit unit 100, when the driving signal i2, which gives the same effect as when the test button is pressed, is generated at the driving signal output terminal A of the controller 300, a current from the first DC power supply DC1 flows to the light emitting side of the phototriac 110 so that the phototriac 110 is turned on. Accordingly, the triac 120 is turned on to allow the current to flow to opposite ends of the triac 120 even without pressing the test button 20, whereby pseudo short circuit signal is generated, and the generated pseudo short circuit signal may be detected by the zero phase current transformer 30.

The pseudo short circuit signal shut-off circuit unit 220 may induce the short circuit detection signal by the pseudo short circuit signal to a second power supply grounding 221, thereby preventing the short circuit detection signal by the pseudo short circuit signal from flowing to the driving unit 50. More specifically, a light emitting element of a second photocoupler 222 is installed between a third DC power supply DC3 branched off from the AC/DC power supply device 500 and a shut-off signal output terminal B of the controller 300. In addition, one side of a light receiving element of the second photocoupler 222 is connected between the pseudo short circuit signal recognition circuit unit 210 and the driving unit 50, and an opposite side of the light receiving element of the second photocoupler 222 is connected to the second power supply grounding 221.

Therefore, according to the configuration example of the pseudo short circuit signal shut-off circuit unit 220, when the signal is controlled to generate the shut-off signal i3 at the shut-off signal output terminal B of the controller 300, current from the third DC power supply DC3 flows to the light emitting element of the second photocoupler 222, thereby outputting an optical signal. At this time, when the light receiving element of the second photocoupler 222 is transferred optical signal of the light emitting element of the second photocoupler 222 and is turned on, the current flowing from the short circuit detection unit 10 to a direction of the driving unit 50 flows into the light receiving element of the second coupler 222 and is induced to the second power supply grounding 221.

However, in the case of the above-described configuration example, when the light emitting element of the second photocoupler 222 is turned on, the pseudo short circuit signal shut-off circuit unit 220 is configured to shut off the current flowing from the short circuit detection unit 10 to the driving unit 50 regardless of whether the current is due to an actual short circuit or a pseudo short circuit signal. Therefore, the controller 300 outputs a shut-off signal i3 before generating the driving signal i2, which gives the same effect as when the test button is pressed, thereby allowing only the short circuit detection signal due to the pseudo short circuit signal to be blocked and does not output the blocking signal i3 in the case after having tested the short circuit breaker, thereby allowing the short circuit detection signal due to an actual short circuit or an operation of the test button 20 to flow to the driving unit 50, whereby the shut-off unit 40 is allowed to operate.

In the case of the pseudo short circuit signal recognition circuit unit 210, a light emitting element of a first photocoupler 212 is connected between the short circuit detection unit 10 and the driving unit 50, and a light receiving element of the first photocoupler 212 is connected between a second DC power DC2 branched off from the AC/DC power supply device 500 and a diagnosis signal input terminal D of the controller 300.

Therefore, according to the configuration example of the pseudo short circuit signal recognition circuit unit 210, an input side of the pseudo short circuit signal recognition circuit unit 210 is connected between the short circuit detection unit 10 and the driving unit 50, and an output side of the pseudo short circuit signal recognition circuit unit 210 is connected to the controller 300. At this time, the pseudo short circuit signal recognition circuit unit 210 connects between the controller 300 and, the short circuit detection unit 10 and driving unit 50 by the first photocoupler 212 so that opposite sides of the first photocoupler 212 are to be electrically insulated.

In addition, when the short circuit detection signal generated in the short circuit detection unit 10 flows to the light emitting element of the first photocoupler 212 and an optical signal is output, the light receiving element of the first photocoupler 212, which is transferred the output optical signal of the light emitting element of the first photocoupler 212, is turned on. Therefore, a current of the second DC power supply DC2 is induced to a first power supply grounding 211, and a generated diagnosis signal i4 generated accordingly is transferred to the controller 300. At this time, the controller 300 checks a good or bad state of the short circuit breaker through the input diagnosis signal i4.

In the case of the above-described configuration example, when the short circuit detection signal is caused by the actual short circuit, the operation of the test button 20, and the pseudo short circuit signal, each signal is input to the pseudo short circuit signal recognition circuit unit 210. Therefore, the controller 300 may check whether the short circuit breaker operates not only during the checking is performed by the driving signal i2, which gives the same effect as the test button is pressed, but also when the actual short circuit or the test button 20 is manually operated.

The controller 300 includes: the driving signal output terminal A configured to generate the driving signal i2, which gives the same effect as the test button is pressed, to the pseudo short circuit signal driving circuit unit 100; the shut-off signal output terminal B configured to output the shut-off signal i3 to the pseudo short circuit signal shut-off circuit unit 220; a power supply input terminal C configured to receive the power supply for operation of the controller 300; and the diagnosis signal input terminal D configured to receive the diagnosis signal i4 from the pseudo short circuit signal recognition circuit unit 210, and may further include: a generation-reference signal input terminal H configured to receive the generation-reference signal i1 from a square wave generation circuit 400; and a diagnosis interval input terminal E to which an interval setting value for automatic diagnosis of the short circuit breaker is input.

In addition, the controller 300 may further include: an ID number input terminal F to which an ID number setting value for smoothly managing a plurality of short circuit breakers is input when there is the plurality of the short circuit breakers; and a communication terminal G configured to transmit and receive remote- and short-distance communication control signals.

In relation to the communication terminal G, when a disaster such as a flood occurs at a location where the short circuit breaker is installed, an electric shock accident may be prevented by operating the shut-off unit 40 of the short circuit breaker using remote communication. More specifically, when a shut-off request signal is input to the communication terminal G, the controller 300 generates the driving signal i2, which gives the same effect as when the test button is pressed, with respect to the pseudo short circuit signal driving circuit unit 100 in order to operate the shut-off unit 40. Accordingly, the same effect as when the test button 20 is operated is generated in the power supply and the shut-off unit 40 is operated. Therefore, in such a case, to be distinguished from when the checking of the short circuit breaker is performed, the controller 300 is managed not to output the blocking signal i3 before the driving signal i2, which gives the same effect as when the test button is pressed, is generated.

In addition, the controller 300 may further include a display device 320 that displays whether or not the diagnosis signal i4 from the pseudo short circuit signal recognition circuit unit 210 is input or not and allows the user and the like to visually recognize a display status. At this time, an LED and the like that output an optical signal whenever the diagnosis signal i4 is input may be applied to the display device 320 but are not limited to the present example and may be various.

Furthermore, as seen in the exemplary configuration examples of the pseudo short circuit signal driving circuit unit 100, the pseudo short circuit signal recognition circuit unit 210, the pseudo short circuit signal shut-off circuit unit 220, and the square wave generation circuit 400, those such as the pseudo short circuit signal driving circuit unit 100, the pseudo short circuit signal recognition circuit unit 210, the pseudo short circuit signal shut-off circuit unit 220, and the square wave generation circuit 400 are configured to be electrically insulated from the controller 300 and thus easily protect the controller 300 from lightning strikes and the like.

Furthermore, the present disclosure may further include the square wave generation circuit 400 configured to provide a generation-reference signal i1 formed in a square wave, by receiving the power supply from the power supply lines H and N to the controller 300, and to accordingly provide a reference point for generating the driving signal i2 that gives the same effect as when the test button is pressed. Meanwhile, the controller 300 is configured to generate the driving signal i2, which gives the same effect as when the test button is pressed, and the blocking signal i3, according to the interval of the received generation-reference signal i1, thereby allowing a continuous automatic checking to be performed according to a predetermined interval of the short circuit breaker without any special external operation instruction. In addition, the automatic checking interval of the short circuit breaker may be adjusted by varying the generation interval of the driving signal i2, which gives the same effect as when the test button is pressed, generated on the basis of the generation-reference signal i1 according to the value set to the diagnosis interval input terminal E of the controller 300.

Looking at an exemplary configuration example of the square wave generation circuit 400, the square wave generation circuit 400 is configured to connect the controller 300 and the power supply lines H and N in a way to be electrically insulated by a third photocoupler 420.

More specifically, a light emitting element of the third photocoupler 420 is connected to the power supply lines H and N, and one side of a light receiving element of the third photocoupler 420 is connected to the generation-reference signal terminal H of the controller 300 and a fourth DC power supply DC4, and an opposite side of the light receiving element of the third photocoupler 420 is connected to a third power supply grounding 410. In addition, a second resistor R2 and a third resistor R3 are disposed between the opposite ends of the light emitting element, of the third photocoupler 420, and the power supply lines H and N, respectively.

Therefore, according to the configuration example of the square wave generation circuit 400, while the power supply from the power supply lines H and N flows to the light emitting element of the third photocoupler 420, a light receiving element of the third photocoupler 420 is turned ON or OFF according to a predetermined interval of the third photocoupler 420, and a square wave generated accordingly is transferred to the controller 300.

Hereinafter, the operation of the present disclosure will be described with reference to the embodiment of FIG. 1.

1. When Automatic Checking of the Short Circuit Breaker is Performed

When the square wave generation circuit 400 outputs the generation-reference signal i1 to the controller 300, the controller 300 generates, at a regular interval, the driving signal i2, which gives the same effect as when the test button is pressed, with respect to the pseudo short circuit signal driving circuit unit 100 on the basis of the generation-reference signal i1. Of course, the controller 300 outputs the blocking signal i3 with respect to the pseudo short circuit signal shut-off circuit unit 220 before generating the driving signal i2 that gives the same effect as when the test button is pressed. At this time, as the current from the third DC power supply DC3 passes through the light emitting element of the second photocoupler 222 due to the output blocking signal i3, a current also flows to the light receiving element of the second photocoupler 222, thereby being induced to the second power supply grounding 221.

Subsequently, the controller 300 generates a driving signal i2 that gives the same effect as when the test button is pressed, and accordingly, when the current from the first DC power supply DC1 flows to the light emitting side of the phototriac 110, a pseudo short circuit signal is output as a current flows to the triac 120 and the light-receiving side of the phototriac 110, thereby generating a current difference in the power supply lines H and N. At the same time, a magnetic field is formed in the zero phase current transformer 30 and is input to the short circuit detection unit 10, and accordingly, the short circuit detection unit 10 generates a short circuit detection signal.

While flowing toward the driving unit 50, the short circuit detection signal due to the pseudo short circuit signal turns on the first transistor TR1 of the pseudo short circuit signal recognition circuit unit 210. At this time, a current flows to the light emitting element of the first photocoupler 212, whereby an optical signal is output. Then, the optical signal output from the light emitting element of the first photocoupler 212 is transferred to the controller 300 as a diagnosis signal i4 through the light receiving element of the first photocoupler 212. Meanwhile, the controller 300 determines whether the short circuit breaker operates normally with the transferred diagnosis signal i4 and determines that there is an abnormality in the short circuit breaker when the diagnosis signal i4 is not transferred thereto.

In addition, whether or not the diagnosis signal i4 is transferred is displayed on the display device 320, and the display device 320 includes LED1 displaying a red optical signal and LED2 displaying a blue optical signal. Therefore, in a state where there is no diagnosis signal i4 transferred to the controller 300, the light is output from the LED1 and is switched to be output from the LED2 whenever the diagnosis signal i4 is input to the controller 300.

In addition, a remaining portion, which does not flow to the pseudo short circuit signal recognition circuit unit 210, of the short circuit detection signal due to the pseudo short circuit signal is induced to the second power supply grounding 221 by flowing into the receiving element of the second photocoupler 222 that is maintained in an ON state due to the blocking signal i3 of the controller 300. As a result, the current does not flow to the driving unit 50.

Therefore, it is possible to perform checking of the short circuit breaker at the regular interval without shutting off the power supply, and it is possible to prevent an erroneous judgment for a case that the shut-off unit 40 does not operate because a short circuit current does not occur due to a failure of the test button 20 and the like. In addition, when the short circuit breaker is being checked, the current flowing to the driving unit 50 is shut off by being induced to the second power supply grounding 221, so that unnecessary current is prevented from flowing to the driving unit 50, thereby reducing the possibility of circuit damage and the like.

2. When Actual Short Circuit Occurs

When a current difference is generated in the power supply lines H and N due to an actual short circuit, a magnetic field is formed in the zero phase current transformer 30 and is input to the short circuit detection unit 10. Accordingly, the short circuit detection unit 10 generates a short circuit detection signal.

The short circuit detection signal according to the actual short circuit is transferred to the controller 300 as the diagnosis signal i4 through the pseudo short circuit signal recognition circuit unit 210 in the same manner as when the automatic checking of the short circuit breaker is performed. At this time, the controller 300 may determine that the short circuit breaker operates normally through the received diagnosis signal i4, and whether or not the diagnosis signal i4 is transferred is displayed on the display device 320. In this case, the operating principle of the display device 320 is the same as when the automatic checking of the short circuit breaker is performed.

However, when the actual short circuit occurs, the blocking signal i3 is not output from the controller 300 unlike when the automatic checking of the short circuit breaker is performed, so the short circuit detection signal due to the actual short circuit is not induced to the second power supply grounding 221 and flows into the driving unit 50, thereby operating the shut-off unit 40.

The drawing shown above for the description of the present disclosure is one embodiment in which the present disclosure is to be embodied. As shown in the drawing, it may be seen that various types of combinations are possible in order to realize the gist of the present disclosure.

Therefore, the present disclosure is not limited to the above embodiment, and it will be understood that there is the technical spirit of the present disclosure to the extent possible such that anyone with ordinary skill in the art to which the present disclosure pertains may implement various modifications without departing from the gist of the present disclosure, as claimed in the following claims.

What is claimed is:

1. An automatically testable short circuit breaker, wherein the short circuit breaker comprises: power supply lines connected to a main power supply circuit; a test button configured to generate a short circuit current in the power supply lines, thereby checking an operating state of the short circuit breaker; a zero phase current transformer configured to detect the short circuit current between the power supply lines; a shut-off unit installed in the power supply lines, thereby performing functions of supplying and shutting off a power supply; a driving unit configured to control a power supply shut-off operation of the shut-off unit; and a short circuit detection unit configured to determine whether a short circuit current is generated from the zero current transformer, thereby generating a short circuit detection signal, the short circuit breaker further comprising:

a pseudo short circuit signal driving circuit unit connected to opposite ends of the test button, thereby generating, without having windings with respect to the zero phase current transformer, a pseudo short circuit signal giving the same effect as when the opposite ends of the test button are connected to each other;

a pseudo short circuit signal recognition circuit unit connected between the short circuit detection unit and the driving unit and configured to recognize the short circuit detection signal, thereby outputting a diagnosis signal;

a pseudo short circuit signal shut-off circuit unit connected between the pseudo short circuit signal recognition circuit unit and the driving unit and configured to induce the short circuit detection signal to grounding in a condition that the pseudo short circuit signal driving circuit unit operates, so that the short circuit detection signal is shut off without flowing into the driving unit; and a controller configured not only to generate a driving signal giving the same effect as when the test button is pressed to the pseudo short circuit signal driving circuit unit so as to give the same effect as when the opposite ends of the test button are connected to each other but also to determine whether the short circuit breaker operates normally by receiving the diagnosis signal output from the pseudo short circuit signal recognition circuit unit.

2. The short circuit breaker of claim 1, further comprising:

a square wave generation circuit configured to form a square wave by receiving the power supply from the power supply lines, thereby providing a generation-reference signal for generating the driving signal, which gives the same effect as when the test button is pressed, to the controller, wherein the controller is configured to receive the generation-reference signal from the square wave generation circuit, thereby generating the driving signal, which gives the same effect as when the test button is pressed, on the basis of a generation interval of the generation-reference signal.

3. The short circuit breaker of claim 2, wherein the controller is further configured to:

adjust a generation interval of the driving signal giving the same effect as when the test button is pressed according to a setting value, on the basis of the above input generation-reference signal.

4. The short circuit breaker of claim 2, wherein the pseudo short circuit signal driving circuit unit, the pseudo short circuit signal recognition circuit unit; the pseudo short circuit signal shut-off circuit unit, or the square wave generation circuit is configured to be electrically insulated using an optical coupling device.

5. The short circuit breaker of claim 1, wherein the controller further comprises:

a display device configured to display visually and recognizably whether or not the diagnosis signal from the pseudo short circuit signal recognition circuit unit is input.

* * * * *